United States Patent [19]

Ito

[11] 3,814,988

[45] June 4, 1974

[54] DETECTING CIRCUIT FOR A MAIN AMPLIFIER PROTECTING CIRCUIT

[75] Inventor: Hideo Ito, Fujisawa, Japan

[73] Assignee: Pioneer Electronic Corporation, Ohta-ku, Tokyo, Japan

[22] Filed: Dec. 7, 1971

[21] Appl. No.: 205,735

[30] Foreign Application Priority Data

Dec. 7, 1970 Japan .......................... 45-121027[U]

[52] U.S. Cl. .......... 317/31 R, 330/270 P, 317/33 R, 323/75 H

[51] Int. Cl. .............................................. H02h 3/26

[58] Field of Search ......... 323/75 N; 330/207 P, 51; 307/202; 317/31, 33 R, 27 R; 324/98, 101

[56] References Cited

UNITED STATES PATENTS 3,448,394 6/1969 Rheaume ........................ 330/207 P 3,536,958 10/1970 Sondermeyer .................. 330/207 R 3,657,603 4/1972 Adams ................................. 317/31

*Primary Examiner*—J. D. Miller
*Assistant Examiner*—Harvey Fendelman
*Attorney, Agent, or Firm*—Richard C. Sughrue

[57] ABSTRACT

A detecting circuit for a main amplifier protecting circuit, the detecting circuit having a pair of diodes connected to push-pull transistors of the amplifier each conducting when one of the transistors becomes ON, a load and resistors connected to the push-pull output transistors in the form of bridge circuits when the diode becomes ON, whereby the outputs of the respective bridge circuits are common, the main amplifier being protected by activating the protecting circuit from the output of the bridge circuits when the resistance of the load becomes less than a predetermined value.

9 Claims, 2 Drawing Figures

DETECTING CIRCUIT FOR A MAIN AMPLIFIER PROTECTING CIRCUIT

BACKGROUND OF THE INVENTION

1. Field of the Invention

This invention relates to a detecting circuit for a main amplifier protecting circuit, and more particularly to a detecting circuit for a protecting circuit which prevents the main amplifier from being damaged due to excessive current caused by a load, having a resistance lower than a predetermined load resistance, being connected to the main amplifier, the amplifier being designed for use with a load having the predetermined resistance.

When a main amplifier is normally designed, the resistance, in ohms, of the impedance to be connected to the load is determined so as to provide the amplifier with properly rated components. However, the resistance of a load, such as speaker, which may be connected to the main amplifier may have various values such as 4, 8, 16 ohms. If the main amplifier is designed for a load resistance of 16 ohms, the connecting of an 8 or 4 ohms load to the main amplifier causes excessive current flow through the main amplifier, causing parts of the main amplifier, such as the output transistors, to burn out.

SUMMARY OF THE INVENTION

This invention eliminates the aforementioned disadvantages of the prior art by providing a detecting circuit operating in association with a main amplifier and a protecting circuit for separating the load from the amplifier or the amplifier from the driver circuit. The detecting circuit detects when the load resistance is below that for which the main amplifier was designed and signals the protecting circuit into operation so as to prevent the main amplifier from being damaged as a result of excessive current flow therethrough.

It is another object of this invention to provide a detecting circuit for a main amplifier protecting circuit which may positively detect whether the load resistance is lower than a prespecified resistance by providing a bridge circuit, the output of which provides an indication of whether or not the load resistance is below a specified value.

According to one aspect of this invention, there is provided a detecting circuit for a main amplifier protecting circuit which comprises a first diode coupled to one of a pair of push-pull output transistors of the main amplifier, the diode becoming conducting when the transistor to which it is coupled turns ON. Similarly, a second diode is coupled to the other of the pair of transistors and becomes conductive when that transistor turns ON. The load and a plurality of resistors are connected to the push-pull output transistors in the form of a pair of bridge circuits having common outputs. Each bridge circuit has one diode connected in one leg thereof, each of the bridge circuits becoming operative only when its diode is conducting.

BRIEF DESCRIPTION OF THE DRAWINGS

Other objects, features and advantages of this invention will become apparent from the following description taken in conjunction with the accompanying drawings, in which.

DETAILED DESCRIPTION OF THE PREFERRED EMBODIMENT

Figure 1:
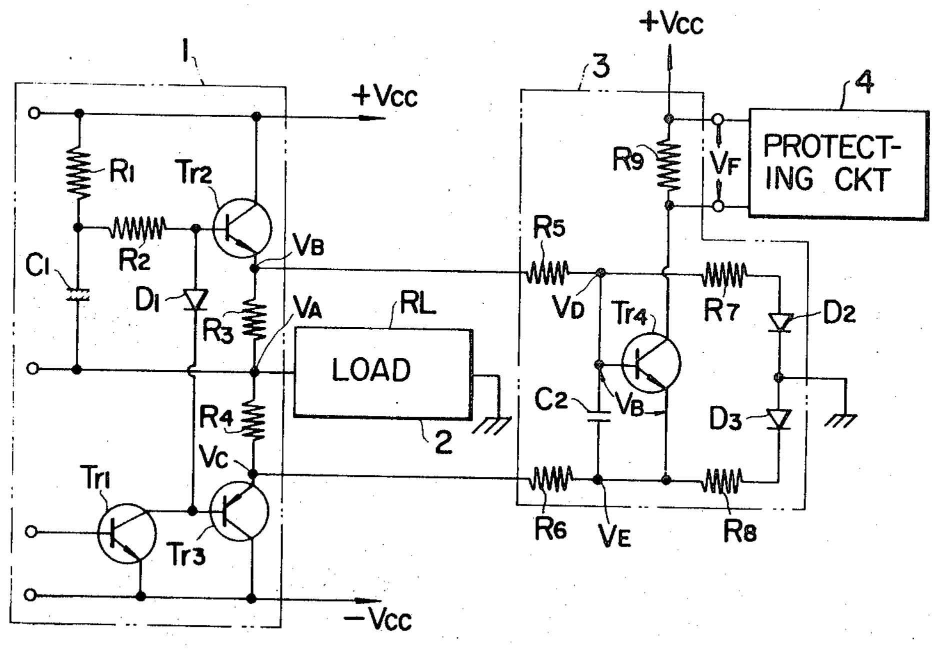
FIG. 1 is a circuit diagram of one embodiment of the present invention showing a main amplifier, the detecting circuit and a protecting circuit responsive to the output of the detecting circuit.

Reference numeral 1 illustrates a two power supply type main amplifier comprising transistors Tr1, Tr2 and Tr3, resistors R1 to R4, condenser C1 and diode D1. Numeral 2 designates a load such as a speaker having an impedance RL. Numeral 3 designates a detecting circuit comprising transistor Tr4, resistors R5 to R8, condenser C2 and diodes D2 and D3, while numeral 4, designates a protecting circuit for the main amplifier.

More particularly, the emitter of the transistor Tr2 and the emitter of transistor Tr3 are connected to resistors R3 and R4, respectively. The other ends of these resistors are connected through the load 2 (such as a speaker) to a reference potential represented here as ground. Also connected to the emitter of transistor Tr2 is one end of resistor R5, while to the emitter of transistor Tr3 is also connected one end of resistor R6. The other end of the resistor R5 is connected to the base of the transistor Tr4 and one end of the resistor R7. The other end of the resistor R6 is connected through the condenser C2 to the base of the transistor Tr4, and directly to the emitter of the transistor Tr4 and one end of the resistor R8. Further, the other end of the resistor R7 is connected through the diode D2 to ground, while the other end of resistor R8 is connected through the diode D3 to ground. The collector of transistor Tr4 is connected the resistor R9 which is coupled across the input to the protecting circuit 4.

Figure 2:
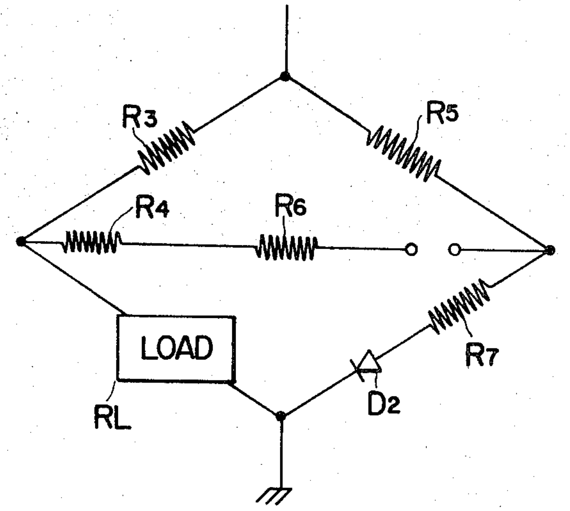
FIG. 2 is an equivalent circuit diagram of one of the bridge circuits used in the present invention.

Referring to FIG. 2, if the diode D2 conducts, a bridge circuit is realized, and accordingly, the relationship between resistors R3, R5, R7 and $R_L$ can be expressed by the formula R3R7 = R5$R_L$ when the bridge is balanced. If the diode D3 is conductive a second bridge circuit is provided with the resistors R4, R6, R8 and $R_L$ forming the legs of the bridge circuit, the resistance of forward biased D3 being neglected. Accordingly, the relationship between the resistors can be expressed by the formula R4R8 = R6$R_L$ when the bridge is balanced. $V_A$ represents the potential at the connecting point of the resistors R3 and R4, $V_B$ the emitter voltage of the transistor Tr2, $V_C$ the emitter voltage of the transistor Tr3, $V_D$ the base voltage of the transistor Tr4, $V_E$ the emitter voltage of the transistor Tr4, $V_F$ the voltage across resistor R9, and Vb the voltage between the base and the emitter of transistor Tr4.

In operation, when the transistor Tr2 turns ON, the output voltage $V_A$ approaches the potential +Vcc.

The diode D2 is so connected as to be forward biased when $V_A$ is positive, with the result that an electric current flows through the transistor Tr2, resistors R5 and R7, diode D2 to ground.

On the other hand, since the transistor Tr3 is OFF, the diode D3 is also OFF. Accordingly, the voltage of the respective points may be expressed as follows:

$$V_D \approx R7/(R5 + R7) \cdot V_B \qquad (1)$$

$$V_A \approx R_L/(R_L + R3) \cdot V_B \quad (2)$$

$$V_E \approx V_A \quad (3)$$

If $R_L$ is selected so that a balanced bridge results, $$V_A = V_D \approx V_E \quad (4)$$

$$(R_L/R_L + R3) = (R7/R5 + R7) \quad (5)$$

$$R_L R5 = R3R7 \quad (6)$$

Further, since the bridge circuit is balanced, the voltage $Vb = V_D - V_E$ becomes zero volts from Equation 4.

If the load 2 has a larger resistance than that of the selected resistor $R_L$, $V_D < V_E$ and the voltage $Vb$ becomes negative. As a result, transistor Tr4 remains in an OFF state and no electric current flows through the resistor R9 and therefore $V_F$ remains at zero volts.

On the other hand, if the resistance of load 2 is smaller than that of the selected $R_L$ which balances the bridge, $V_D > V_E$ and the voltage $Vb$ becomes positive. Accordingly, the transistor Tr4 turns ON, so that an electric current flows through the resistor R9 causing a potential to appear across the resistor. This potential is used to trigger the protecting circuit which may be a relay or other suitable means for interrupting a circuit. When the protecting circuit 4 is triggered, the main amplifier 1 is disconnected from the load 2 or the main amplifier is disconnected from the driver circuit (not shown). In this manner burn out of the components of the main amplifier due to excessive current is avoided.

If transistor Tr3 of the main amplifier 1 turns ON, the output voltage $V_A$ approaches $-Vcc$, so that it becomes a negative voltage, and an electric current flows from the ground, through the diode D3, resistors R8 and R6 to the transistor TR3. Accordingly, the voltage at the respective points is expressed as follows:

$$V_D \approx V_A,\ V_A \approx R_L/(R_L + R4) \cdot Vc,\ V_E \approx R8/(R8 + R6) \cdot Vc$$

When $R_L$ is chosen to form a balanced bridge the relationship between the resistors R4, $R_L$, R6 and R8 can be expressed by the formula $R8 = R_L \cdot R6/R4$. When the resistance of the load is equal to $R_L$ the voltage $Vb$ equals zero. If the load 2 has a resistance larger than $R_L$, $V_D < V_E$, and the voltage Vb becomes negative. Under these conditions, the transistor Tr4 is OFF, and the detecting circuit output voltage $V_F$ is zero. On the other hand, if the resistance of load 2 is smaller than $R_L$, $V_D > V_E$, with the result that the voltage $Vb$ becomes positive. Therefore, transistor Tr4 turns ON, causing an output voltage $V_F$ across resistor R9 to trigger the protecting circuit 4. As previously explained, the protecting circuit contains a relay or other suitable interrupting device to separate the load 2 from the main amplifier 1 or to separate a driver circuit from the main amplifier 1.

Even if the load 2 of the main amplifier 1 is larger than that of the register $R_L$, the condenser C2 connected between the base and emitter of the transistor Tr4 prevents the detecting circuit 3 from operating erroneously. Said erroneous operation is caused by the charge of the current flowing for putting the transistor Tr4 on according to the delay of the switching OFF due to the accumulating effect of the push-pull power transistors Tr2 and Tr3 of the main amplifier when the power of high frequency is derived.

The above example has been described with reference to the case for preventing the main amplifier of two power supply type from being broken, but an apparatus with the output condenser is applicable for the same object.

It should be understood from the foregoing description that since the detecting circuit of this invention constitutes a bridge circuit with the load included in one leg thereof, the value of the load is detected when the transistor to which the bridge circuit is coupled turns ON. The output of the bridge circuit across $V_D$ and $V_E$ gives an indication of the value of the resistance of the load. This output can be used for other purposes besides triggering a protecting circuit 4 when the load resistance is below a specified value. For example, transistor Tr4 can be replaced by a device for supplying an output only when the resistance of the load is too high.

What is claimed is:

1. In a push-pull amplifier circuit the output transistors of said amplifier being coupled to a load, a detecting circuit for a push-pull amplifier protecting circuit comprising; first and second resistance bridge circuits coupled to the push-pull output transistors of the amplifier, one leg of each of said bridge circuits including said load, said bridge circuits having a common output, and means, coupled to said common output and the protecting circuit, for triggering the protecting circuit to disconnect the amplifier from the load when the resistance of the load assumes a value different from a predetermined resistance value determined by the value of the resistances in the legs of said bridge circuits.

2. The detecting circuit of claim 1 wherein said triggering means comprises a triggering transistor, the base-emitter circuit thereof being coupled across the common output of said bridge circuits, the collect terminal being connected to the protecting circuit, and a capacitor coupled in parallel with the base-emitter circuit of said triggering transistor.

3. The circuit of claim 1 wherein said load is connected to the amplifier output transistors through first and second resistors (R3, R4) respectively, said first resistor (R3) forming a first leg of said first bridge circuit, a third resistor (R5) forming a second leg coupled to a first one of said output transistors (Tr2), a third leg including a fourth resistor (R7) being coupled to said first one of said output transistors through said third resistor, the fourth leg of said first bridge comprising said load.

4. The circuit of claim 3 wherein said second bridge circuit includes a first leg including said load, a second leg of said second bridge circuit and said third leg of said first bridge circuit including first and second diodes respectively, said second diode being coupled to the other of said pair of amplifier output transistors through a fifth resistor (R6) forming a third leg of said second bridge circuit, the fourth leg of said second bridge circuit including said second resistor (R4).

5. The circuit of claim 4 wherein said triggering means comprises means for triggering said protecting circuit only when the magnitude of the resistance of the load is less than said predetermined resistance value.

6. The circuit of claim 4 wherein said triggering means comprises means for triggering said protecting circuit only when the resistance of the load is greater than said predetermined resistance value.

7. A detecting circuit, for a main amplifier protecting circuit, comprising a pair of diodes connected to push-pull output transistors of an amplifier one of said diodes conducting when one of said transistors turns ON, a load and resistors connected to said push-pull output transistors in the form of bridge circuits, the outputs of the respective bridge circuits being common, whereby the main amplifier is disconnected from the load by the protecting circuit responsive to the output of the bridge circuits when the resistance of the load becomes less than a predetermined value.

8. A detecting circuit as set forth in claim 7, wherein said main amplifier is of a two power supply type.

9. A detecting circuit as set forth in claim 7, wherein the emitter of one of the output transistors (Tr2) and the emitter of the other output transistor (Tr3) are connected to the resistors (R3 and R4), respectively the other ends of which resistors being connected through the load (2) to ground, one end of a resistor (R5) being connected to the emitter of the transistor (Tr2), one end of a resistor (R6) being connected to the emitter of the transistor (Tr3), the other end of the resistor (R5) being connected to the base of a transistor (Tr4) and one end of the resistor (R7), the other end of the resistor (R6) being connected through a condenser (C2) to the base of the transistor (Tr4), and more over the other end of that resistor being connected to the emitter of the transistor (Tr4) and one end of the resistor (R8), the other end of the resistor (R7) being connected through a diode (D2) to ground, the resistor (R8) being connected through a diode (D3) to ground, and a resistor (R9) being connected to the collector of the transistor (Tr4) in such a manner than when the diode (D2) becomes ON, it equivalently constitutes a bridge circuit, the resistors R3, R5, R7 and $R_1$, being so set as to satisfy the relationship of the formula $R3R7=R5R_L$ and when the diode (D3) becomes ON, the resistors R4, R6, R8 and $R_L$ constitute a bridge circuit these resistors being so set as to satisfy the relationship of the formula $R4R8=R6R_L$.

* * * * *